United States Patent
Tang et al.

(10) Patent No.: US 6,909,108 B2
(45) Date of Patent: Jun. 21, 2005

(54) STRUCTURE OF QUANTUM DOT LIGHT EMITTING DIODE AND METHOD OF FABRICATING THE SAME

(75) Inventors: Shiang-Feng Tang, Taoyuan (TW); Shih-Yen Lin, Hsinchu (TW); Si-Chen Lee, Taipei (TW); Ya-Tung Cherng, Taoyuan (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 10/707,193

(22) Filed: Nov. 26, 2003

(65) Prior Publication Data

US 2004/0183062 A1 Sep. 23, 2004

(30) Foreign Application Priority Data

Mar. 19, 2003 (TW) ........................................ 92105988 A

(51) Int. Cl.[7] ............................................... H01L 29/06
(52) U.S. Cl. ........................... 257/14; 257/102; 257/13; 257/83; 257/21; 257/79; 257/80; 257/18
(58) Field of Search ............................. 257/13, 14, 18, 257/97, 96, 21

(56) References Cited

U.S. PATENT DOCUMENTS 5,780,867 A * 7/1998 Fritz et al. .................... 257/13
2002/0162995 A1 * 11/2002 Petroff et al. ................ 257/21

FOREIGN PATENT DOCUMENTS

JP          2002237456        *  8/2002        ......... H01L/21/203

* cited by examiner

Primary Examiner—Nathan J. Flynn
Assistant Examiner—Fazli Erdem
(74) Attorney, Agent, or Firm—Jianq Chyun IP Office

(57) ABSTRACT

An InAs/GaAs quantum dot light emitting diode and a method of fabricating the same are disclosed. The InAs/GaAs quantum dot light emitting diode which is formed by turning off an As shutter and using As background concentration for epitaxy, comprises a Si-doped GaAs substrate, a N-type structure, an undoped quantum well, aseries of quantum dot layers, spacer layers, a barrier layer and a P-type structure.

6 Claims, 3 Drawing Sheets

STRUCTURE OF QUANTUM DOT LIGHT EMITTING DIODE AND METHOD OF FABRICATING THE SAME

CROSS REFERENCE TO RELATED APPLICATIONS

This application claims the priority benefit of Taiwan application Ser. No. 92105988, filed on Mar. 19, 2003.

BACKGROUND OF INVENTION

1. Field of the Invention

The present invention relates to a structure of InAs/GaAs quantum dot light emitting diode and a method of fabricating the same, and more particularly to a structure of nanotechnology light emitting diode and a method of fabricating the same that can improve sensitivity thereof.

2. Description of the Related Art

Traditionally, the method of forming epitaxial structure is performed by a self-organized mold. Because of difference of material surface energy, the energy creates stress thereon, and the material tends to form a low-dimension crystal shape, such as an island. If a new structure is to be formed, the material property can be applied in the method for forming the structure. In some structures, the periodic variations on the surface of the material, a grain structure can be formed. In three-dimension structure, a crystal structure can be formed because of the stress. Generally, the epitaxy of hetero interface includes three modes Frank-vanderMerwe disclosed in 1949, Volmer-Weber disclosed in 1926 and Stranski-Kranov disclosed in 1937, wherein Stranski-Kranov mode is most popularly used. Traditionally, a cracking valve should be deposed between As shutter of an epitaxial apparatus for forming quantum dot structure. The modification of the epitaxial apparatus, however, costs a lot for changing the As source system of the original epitaxial apparatus.

SUMMARY OF INVENTION

An InAs/GaAs quantum dot light emitting diode is disclosed. InAs/GaAs quantum dot light emitting diode which is formed by turning off an As shutter and using As background concentration for epitaxy, comprises a Si-doped GaAs substrate, a N-type structure, an undoped quantum well, a quantum dot layer, a spacer layer, a barrier layer and a P-type structure. The undoped quantum well can reduce the mobility of carriers within the epitaxial structure and enhance the probability of recombination of electrons and holes, the efficiency of luminescence is, therefore, improved.

DETAILED DESCRIPTION

Figure 1:
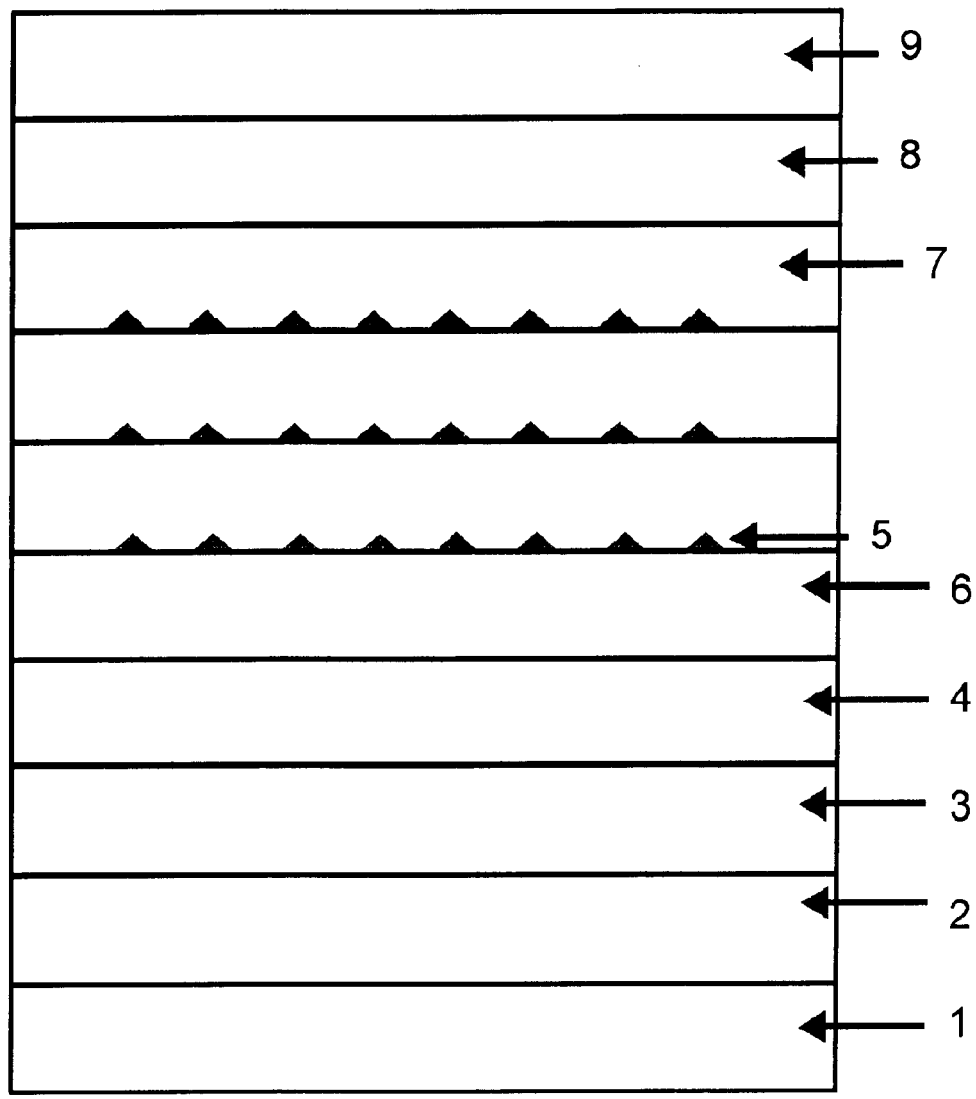
FIG. 1 is a schematic drawing for showing an epitaxial structure.

FIG. 1 is a schematic drawing for showing an epitaxial structure.

Please referring to FIG. 1, a (001)±1° Si-doped GaAs substrate 1, which has a thickness about from 320 $\mu$m to about 380 $\mu$m and dopant concentration from about $1\times10^{18}$ to about $1\times10^{19}$ cm$^{-3}$ is provided. A GaAs buffer layer 2 having a thickness about from 500 nm to about 2000 nm and dopant concentration from about $1\times10^{18}$ to about $5\times10^{19}$ cm$^{-3}$ is formed on the substrate 1 when substrate temperature is about from 580 to about 615° C. Then, a Al$_x$Ga$_{1-x}$As cap layer 3 having a thickness about from 200 nm to about 800 nm and dopant concentration from about $1\times10^{18}$ to about $5\times10^{18}$ cm$^{-3}$ is formed on the GaAs buffer layer 2, wherein x is about 0.3–0.7 when substrate temperature is raised to 610° C. to about 650° C. Two to ten multi-layer GaAs/undoped Al$_x$Ga$_{1-x}$As quantum wells 4 then are formed on the cap layer 3, wherein each quantum well has a thickness about from 3 nm to about 7 nm, and x is about 0.3–0.7 when substrate temperature is down to 580° C. to about 615° C. Three to ten InAs quantum dot mono layers 5 then are formed on the quantum wells 4, wherein each quantum dot mono layer has a thickness from about 2.5 mono layer (ML) to about 4.5 ML, when substrate temperature is down to 470° C. to about 520° C. Then each quantum dot layer is covered with an undoped GaAs spacer layer 6 having a thickness from about 10 nm to about 40 nm. Then, a GaAs barrier layer 7 having a thickness from about 10 nm to about 50 nm is formed on the last spacer layer 6. The InAs quantum dot layer 5 is formed by using an As background concentration in a MBE chamber for epitaxy when an As shutter is turned off, wherein the growth rate of the InAs quantum dot layer 5 is about 0.05–0.5 ML/sec. Then a Al$_x$Ga$_{1-x}$As cap layer 8 having a thickness from about 300 nm to about 700 nm is formed on the GaAs barrier layer 7, wherein x is about 0.3–0.7 and Be concentration is from about $1\times10^{18}$ to about $1\times10^{19}$ cm$^{-3}$. Finally, a GaAs contact layer 9 having a thickness from about 300 nm to about 1000 nm is formed on the cap layer 8, which is doped with Be having concentration from about $5\times10^{18}$ to about $5\times10^{19}$ cm$^{-3}$, and the structure of the quantum dot light emitting diode is complete.

Figure 2:
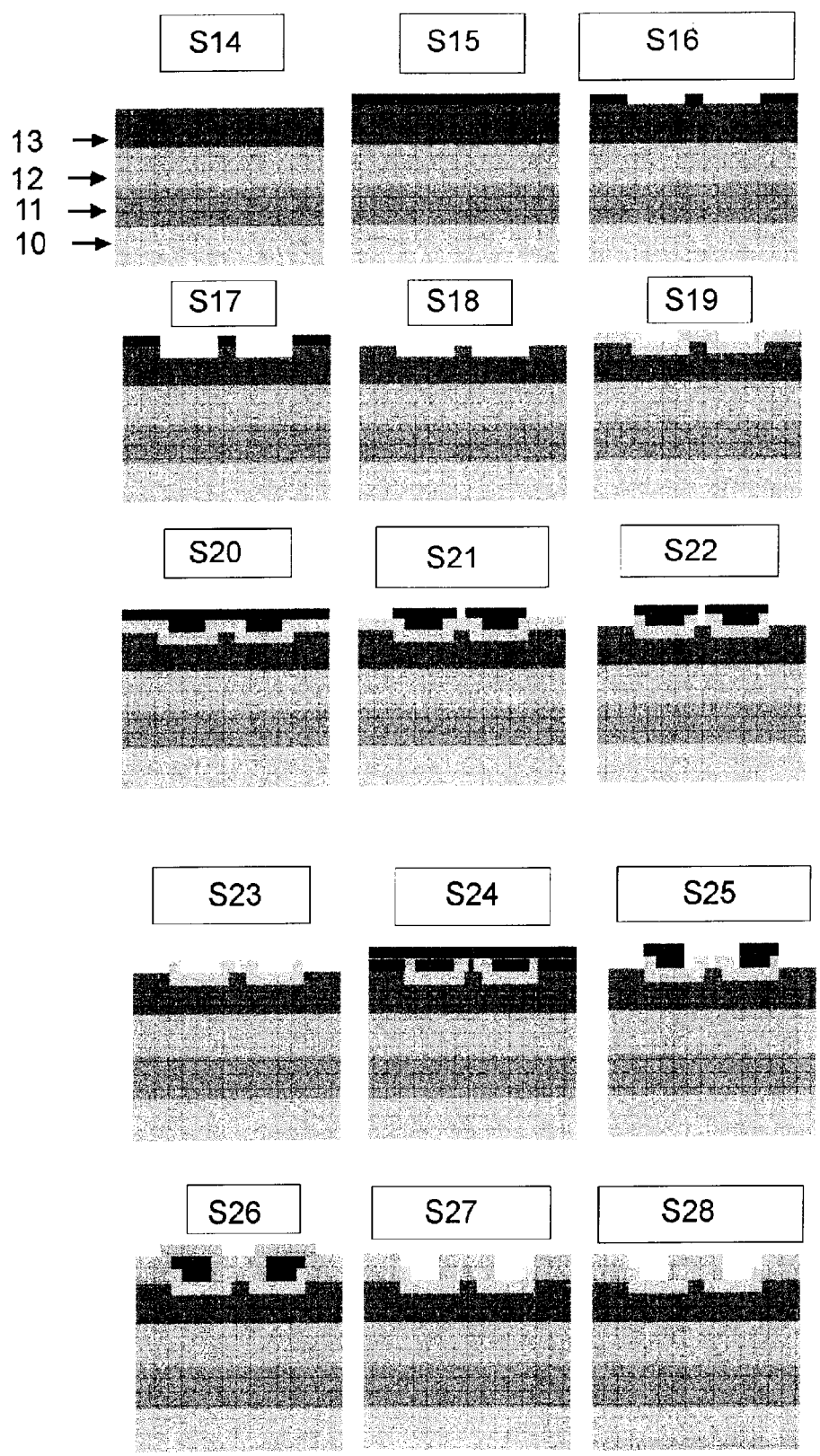
FIG. 2 is a schematic process flow of forming the quantum dot light emitting diode.

FIG. 2 is a schematic process flow of forming the quantum dot light emission diode.

A silicon-doped GaAs substrate 10 having an N-type structure 11, a quantum dot layer 12 and a P-type structure 13 sequentially formed thereon is provided at step S14. Then a photoresist coating step S15 is performed. A photolithographic step S16, an etching step S17, a photoresist removing step S18, a silicon oxide deposition step S19 and a photoresist coating step S20 are then sequentially performed. Then an photolithographic hole step S21, a silicon oxide etching step S22, a photoresist removing step S23, and a photoresist coating step S24 are sequentially performed. A metal deposition step S25, an Au/Be alloy deposition step S26, a lift-off step S27 and a substrate grinding as well as an Au/Ge alloy deposition on the backside of the substrate S28 are sequentially performed.

Figure 3:
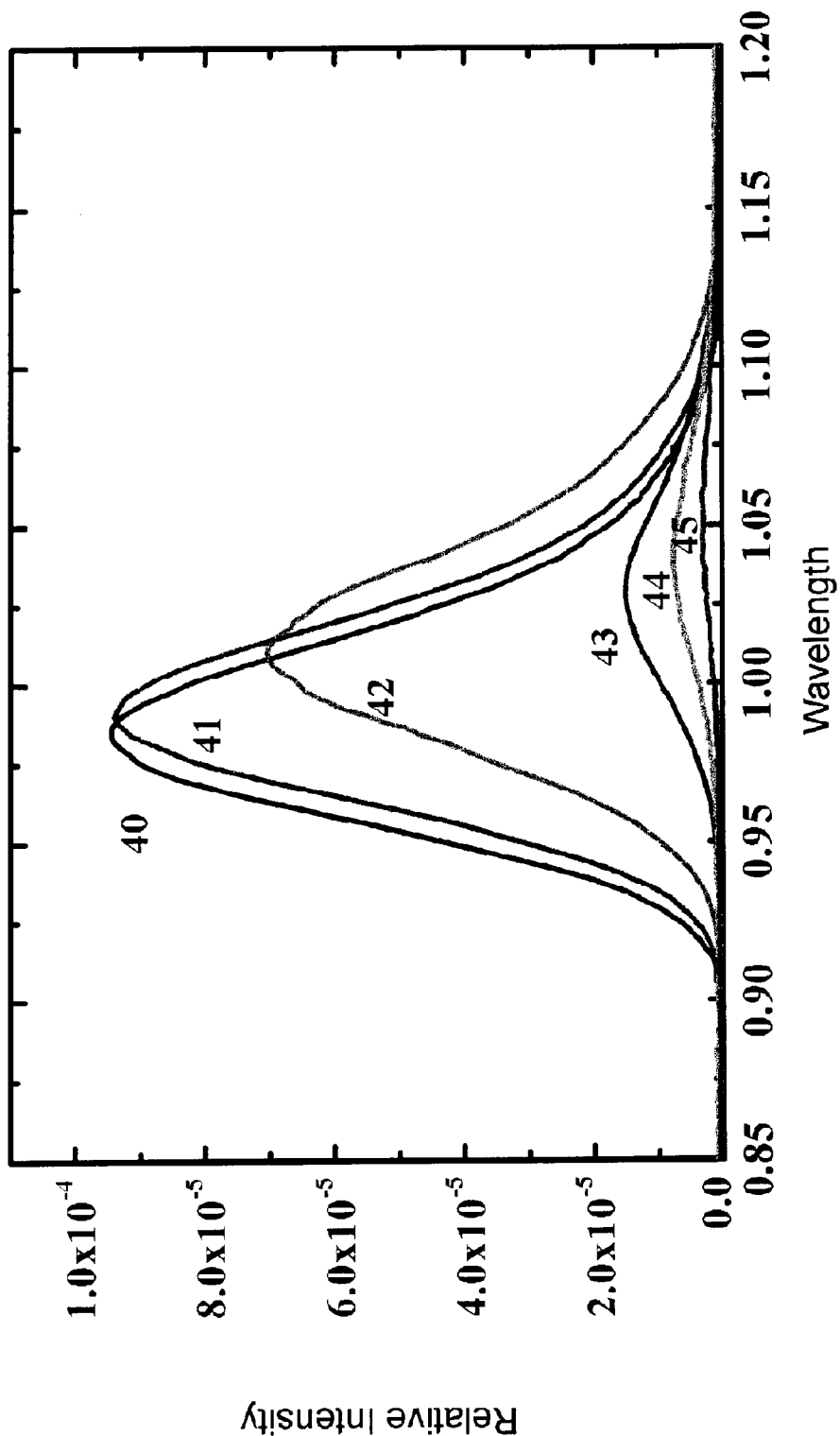
FIG. 3 is electroluminescence measurements of the device varying with temperatures.

FIG. 3 is electroluminescence measurements of the device varying with temperatures, wherein relative Intensity and wavelength show in the curve 40 which represents EL curve at 10° K, the curve 41 represents EL curve at 60° K, the curve 42 represents EL curve at 120° K, the curve 43 represents EL curve at 180° K, the curve 44 represents EL curve at 240° K, and the curve 45 represents EL curve at 300° K.

An InAs/GaAs quantum dot edge light emitting diode with the peak emission wavelength of 1 $\mu$m is disclosed. The shift of peak wavelength is about 0.22 nm/K under 20~300 K. The temperature-dependent broadening of full width at half maximum (FWHM) of electro-luminescence (EL) spectrum is 0.04 nm/K.

Strained layer epitaxy is an effective method for fabricating self-assembled zero dimensional (OD) InAs/GaAs quantum dots. The 7% lattice mismatch between the epitaxial InAs and GaAs layers is performed by Stransky-Krastanov growth mode. The device was grown by solid-source molecular beam epitaxy. When temperature is from about 20 to 300 K, the dark current is reduced from 84 pA to 13 nA at the negative bias of −0.5 V. The ideality factor is abruptly down from about 14 (tunneling current is dominant) at 20 K down to 2 (G-R current) at the range of 100 to 240 K, then approaches to about 1.3 (diffusion current) smoothly. That means that the device has a low dark current and excellent diode electric performance. In addition, the position of peak wavelength is changed from 0.99 to 1.05 $\mu$m due to energy gap shrinkage of semiconductor when increase of temperature. Under the operation during the very large temperature range, the wavelength shift and the broadening FWHM are only 0.22 and 0.04 nm/K, respectively. These results are comparable with resonant cavity LED and the LED with the surfacing multi-player dielectric optical filter. The intensity versus current (L-I) characteristics is essentially linear during the temperature range. The equivalent threshold currents are generated by the parallel constant current leakage path varying with temperature. The slopes of L-I decrease with the increase of temperature.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An InAs/GaAs quantum dot light emitting diode which is formed by turning off an As shutter and using As background concentration for epitaxy, comprising:
   a Si-doped GaAs substrate, a N-type structure, an undoped quantum well, a series of quantum dot layers, spacer layers, a barrier layer and a P-type structure wherein the Si doped GaAs substrate is a (001)±1° substrate and has dopant concentration from about $1\times10^{18}$ to about $1\times10^{19}$ cm$^{-3}$ when substrate temperature is raised to 610° C. to about 650° C.

2. The InAs/GaAs quantum dot light emitting diode of claim 1, wherein an InAs quantum dot layer is formed by using the As background concentration for epitaxy when the As shield is turned off.

3. The InAs/GaAs quantum dot light emitting diode of claim 1, wherein the N-type structure comprising a GaAs buffer layer having a thickness about from 500 nm to about 2000 nm and dopant concentration from about $1\times10^{18}$ to about $5\times10^{18}$ cm$^{-3}$ formed on the substrate, and a $Al_xGa_{1-x}As$ cap layer having a thickness about from 200 nm to about 800 nm and dopant concentration from about $1\times10^{18}$ to about $5\times10^{18}$ cm$^{-3}$ formed on the GaAs buffer layer, wherein x is about 0.3–0.7 when substrate temperature is raised to 610° C. to about 650° C.

4. The InAs/GaAs quantum dot light emitting diode of claim 1, wherein the undoped quantum well layer comprises two to ten multi-layer GaAs/undoped $Al_xGa_{1-x}As$ quantum wells formed on the cap layer, wherein each quantum well has a thickness about from 3 nm to about 7 nm, and x is about 0.3–0.7 when substrate temperature is down to 580° C. to about 615° C.

5. The InAs/GaAs quantum dot light emission diode of claim 4, wherein the quantum dot layer, the spacer layer and the barrier layer comprise three to ten InAs quantum dot molecular layers formed on the quantum wells, wherein each quantum dot molecular layer has a thickness from about 2.5 molecular layer (ML) to about 4.5 ML, when substrate temperature is down to 470° C. to about 520° C.; the each quantum dot layer covered with an undoped InAs spacer layer having a thickness from about 10 nm to about 40 nm; and a GaAs barrier layer having a thickness from about 10 nm to about 50 nm is formed on the last spacer layer.

6. The InAs/GaAs quantum dot light emission diode of claim 5, wherein the P-type structure comprises a $Al_xGa_{1-x}As$ cap layer 8 having a thickness from about 300 nm to about 700 nm formed on the GaAs barrier layer, wherein x is about 0.3–0.7 and Be concentration is from about $1\times10^{18}$ to about $1\times10^{19}$ cm$^{-3}$; and a GaAs contact layer having a thickness from about 300 nm to about 1000 nm formed on the cap layer, which is doped with Be having concentration from about $5\times10^{18}$ to about $5\times10^{19}$ cm$^{-3}$.

* * * * *